(12) United States Patent
Ito

(10) Patent No.: US 8,153,355 B2
(45) Date of Patent: Apr. 10, 2012

(54) IMMERSION SUPPORTING PLATE CLEANING METHOD AND A PATTERN FORMING METHOD

(75) Inventor: Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1057 days.

(21) Appl. No.: 11/898,322

(22) Filed: Sep. 11, 2007

(65) Prior Publication Data

US 2008/0063987 A1 Mar. 13, 2008

(30) Foreign Application Priority Data

Sep. 13, 2006 (JP) .................................. 2006-248377

(51) Int. Cl.
*G03F 7/26* (2006.01)
(52) U.S. Cl. .......................................... 430/322; 134/34
(58) Field of Classification Search .................. 430/322; 134/34
See application file for complete search history.

(56) References Cited

U.S. PATENT DOCUMENTS

2006/0082747 A1 4/2006 Fukuhara et al.

FOREIGN PATENT DOCUMENTS

| JP | 2005-79222 | 3/2005 |
| JP | 2006-49757 | 2/2006 |
| JP | 2006-134999 | 5/2006 |

OTHER PUBLICATIONS

English translation of JP Publication 2006-134999, May 2006.*

\* cited by examiner

*Primary Examiner* — Kathleen Duda
*Assistant Examiner* — Brittany Raymond
(74) *Attorney, Agent, or Firm* — Finnegan, Henderson, Farabow, Garrett & Dunner, L.L.P.

(57) ABSTRACT

An immersion supporting plate cleaning method of cleaning an immersion supporting plate provided around a substrate to be processed in immersion exposure. An immersion boundary between an immersion area contact part and an immersion area noncontact part on the immersion supporting plate formed when an immersion area is moved according to a predetermined exposure area and an exposure map is determined in advance. Then, the immersion supporting plate is cleaned while a cleaning jig is being moved along the determined immersion boundary.

14 Claims, 5 Drawing Sheets

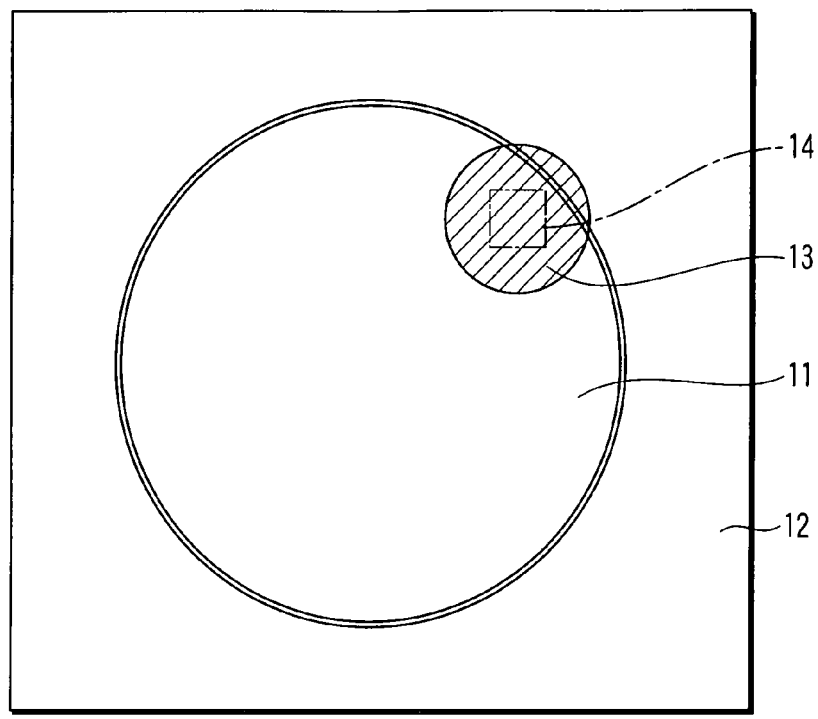
F I G. 1
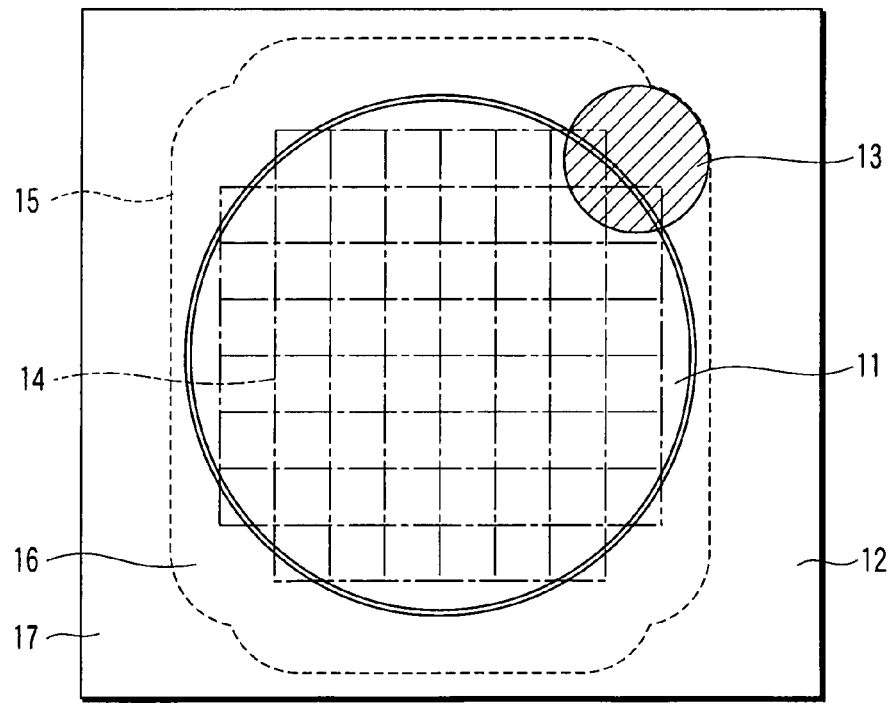
F I G. 2

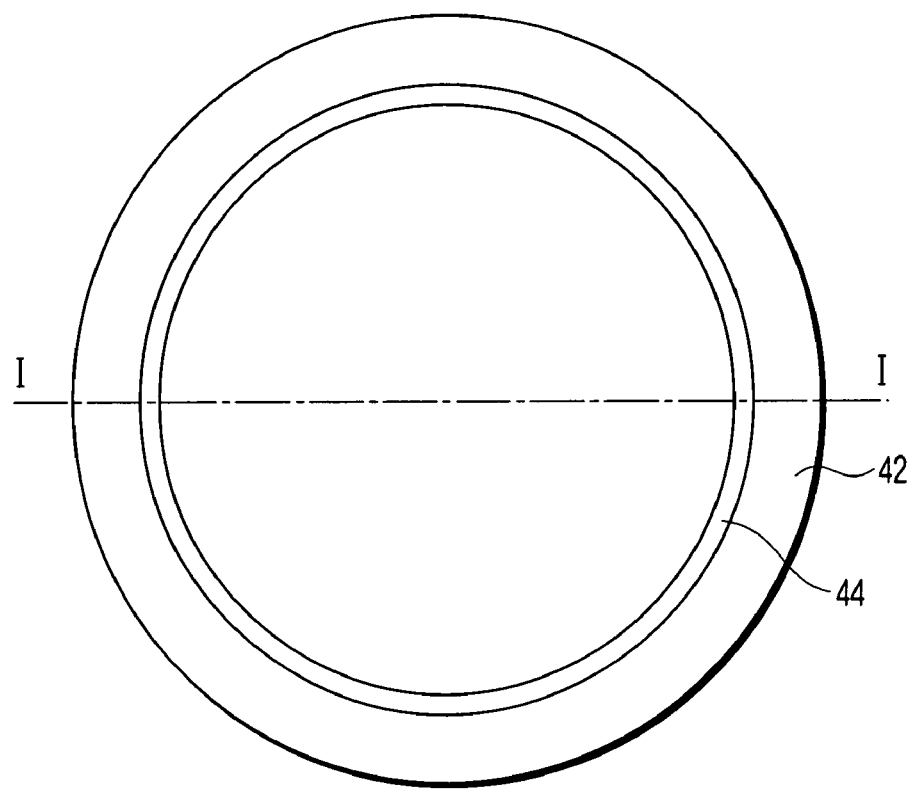
F I G. 4
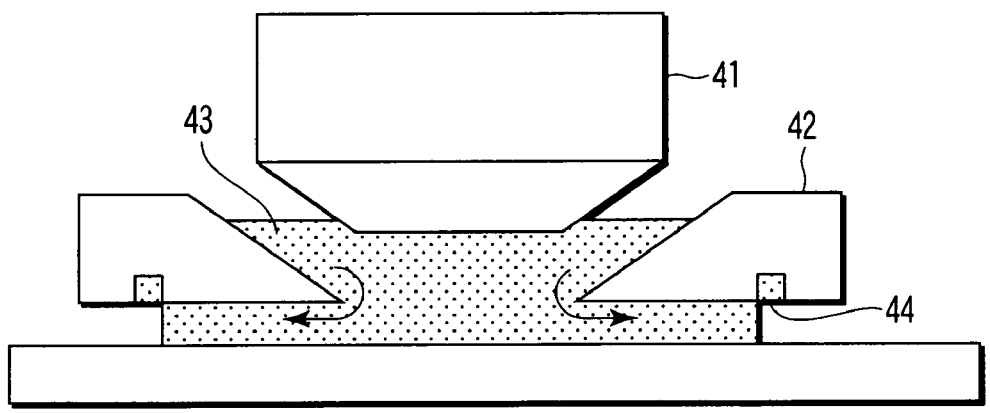
F I G. 5

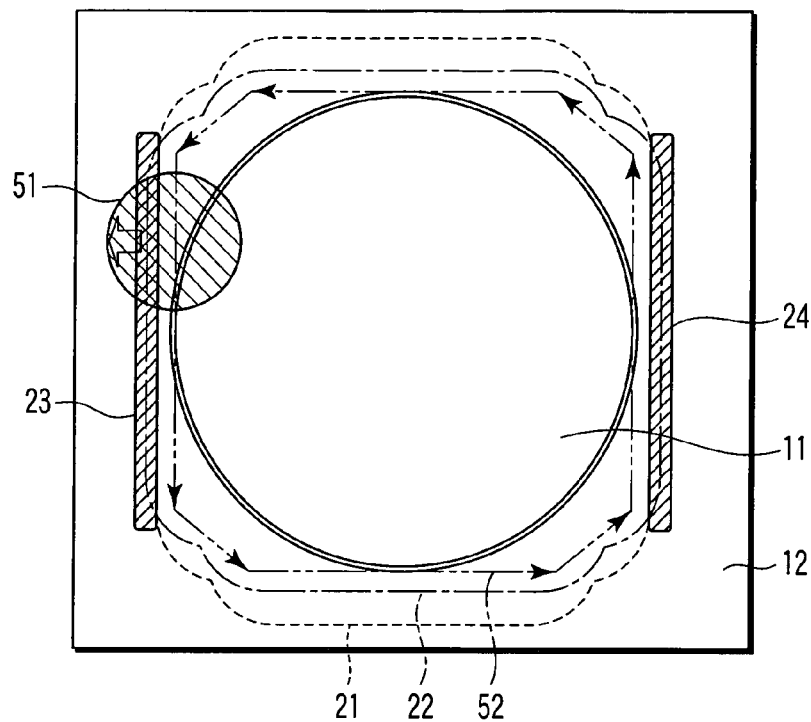
F I G. 6
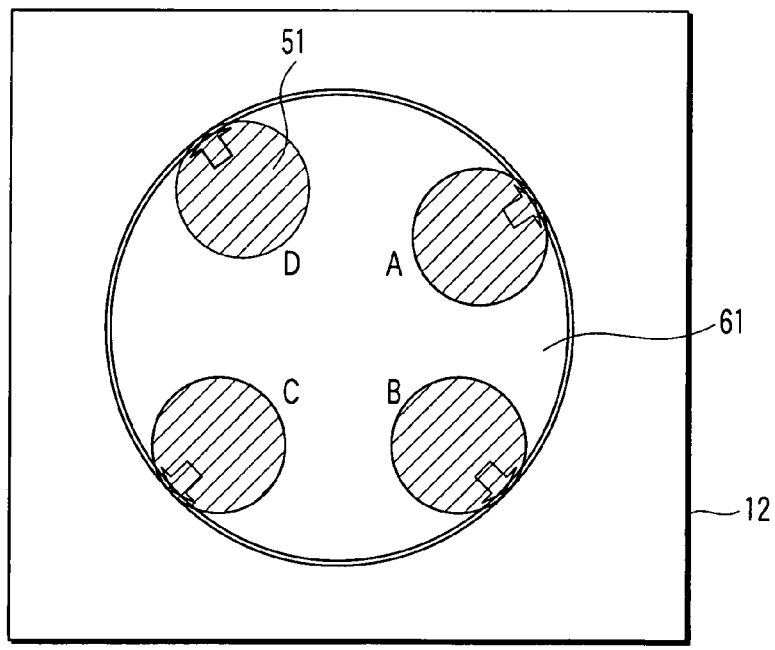
F I G. 7

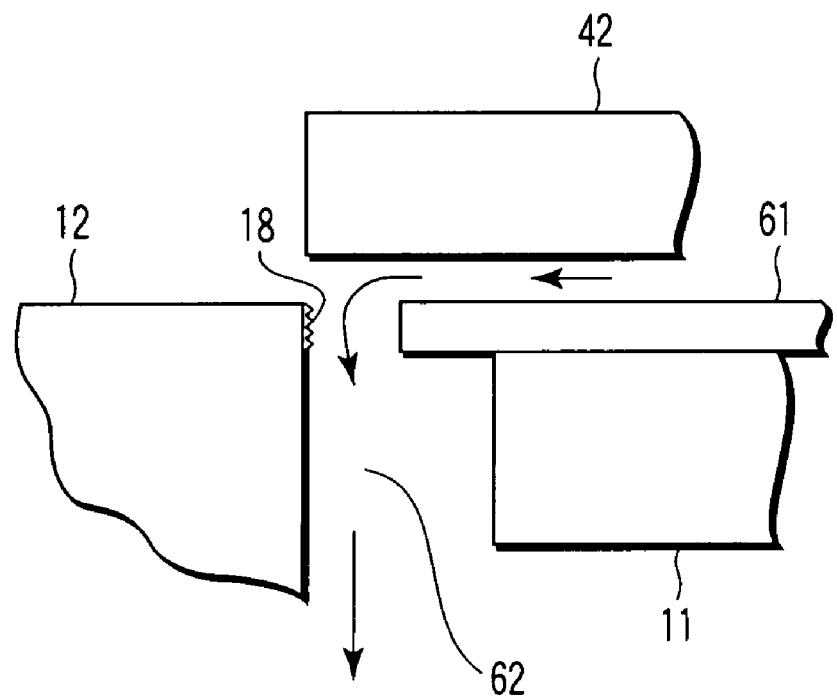
F I G. 8A
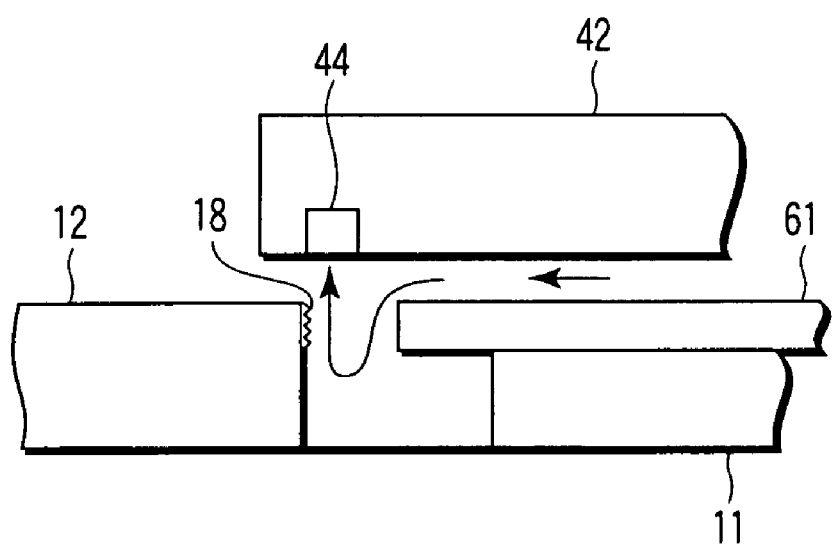
F I G. 8B

IMMERSION SUPPORTING PLATE CLEANING METHOD AND A PATTERN FORMING METHOD

CROSS-REFERENCE TO RELATED APPLICATIONS

This application is based upon and claims the benefit of priority from prior Japanese Patent Application No. 2006-248377, filed Sep. 13, 2006, the entire contents of which are incorporated herein by reference.

BACKGROUND OF THE INVENTION

1. Field of the Invention

This invention relates to an immersion supporting plate cleaning method for cleaning the immersion supporting plate provided around a substrate to be processed in immersion exposure, and a pattern forming method for forming a pattern by immersion exposure using an immersion supporting plate cleaned by the method.

2. Description of the Related Art

Of the known immersion exposure techniques, one of them involves forming an immersion area locally on a substrate to be processed, and then performing exposure while moving the immersion area over the substrate to be processed. To expose the peripheral part of the substrate to be processed, an immersion supporting plate is provided around the substrate to be processed so as to be as high as the substrate in order to maintain the immersion area in exposing the periphery of the substrate to be processed.

Because of various factors, foreign substances, such as particles, can adhere to the immersion supporting plate. Cleaning to remove the foreign substances was done on almost the entire surface of the immersion supporting plate. However, depending on the cleaning method, the following problem arose: the problem of failing to remove the particles properly, such as the problem of spreading foreign substances or of failing to remove foreign substances completely. Moreover, there was another problem: it took much time to clean all of the immersion supporting plate (Jpn. Pat. Appln. KOKAI Publication No. 2005-79222, Jpn. Pat. Appln. KOKAI Publication No. 2006-49757, and Jpn. Pat. Appln. KOKAI Publication No. 2006-134999).

The immersion area is wider than the exposure area. In the area through which and with which the immersion area passes and makes contact in an exposure operation, since the area is cleaned by the immersion area, particles are less liable to produce. However, in the periphery of the immersion area which the immersion area doesn't contact at all, particles are liable to produce.

At the immersion boundary, the boundary between the immersion area contact part and the immersion area noncontact part, varies, depending on an exposure area (in other words shot size that is depended on the exposure mask pattern) or an exposure map. Therefore, when the substrate to be processed is exposed on the basis of a different exposure area or a different exposure map, the individual boundary areas shift. When the already exposed immersion boundary (a first immersion boundary) is located inward of an immersion boundary (a second immersion boundary) to be exposed next, the particles remaining in the first immersion boundary will be involved in the next exposure. For this reason, the following problems arose: the problem of the exposure characteristic being affected and the problem of permitting particles to increase on the substrate to be processed.

As described above, in the conventional immersion exposure apparatus or immersion exposure method, particles produced at the immersion supporting plates provided around the substrate to be processed, which was the factor that causes exposure failure and a decrease in the exposure accuracy.

BRIEF SUMMARY OF THE INVENTION

According to an aspect of the invention, there is provided an immersion supporting plate cleaning method of cleaning an immersion supporting plate provided around a substrate to be processed in immersion exposure, comprising: determining an immersion boundary between an immersion area contact part and an immersion area noncontact part on the immersion supporting plate formed when an immersion area is moved according to a predetermined exposure area and an exposure map; and cleaning at least a part of the immersion boundary on the immersion supporting plate, while moving a cleaning jig along the determined immersion boundary.

According to another aspect of the invention, there is provided an immersion exposure method of providing an immersion supporting plate around a substrate to be processed placed on a stage and exposing the substrate to be processed by moving an immersion area according to a predetermined exposure area and an exposure map, the immersion exposure method comprising: extracting an immersion boundary between an immersion area contact part and an immersion area noncontact part on the immersion supporting plate formed in moving the immersion area for the exposure to clean the immersion supporting plate regularly; determining a transfer path of a cleaning jig on the basis of the extracted immersion boundary; and placing the substrate to be processed or a dummy substrate on the stage and cleaning at least a part of the immersion boundary on the immersion supporting plate by moving a cleaning jig on the basis of the transfer path, with the immersion supporting plate arranged around the substrate.

According to another aspect of the invention, there is provided an immersion supporting plate cleaning method of cleaning an immersion supporting plate provided around a substrate to be processed placed on a stage and subjected to immersion exposure, the immersion supporting plate cleaning method comprising: placing the substrate to be processed or a dummy substrate on the stage and arranging the immersion supporting plate around the substrate to be processed or the dummy substrate; and not only moving a cleaning jig along a boundary between the substrate to be processed or dummy substrate and the immersion supporting plate and at the same time causing a cleaning liquid to flow into an area including the boundary but also causing a cleaning liquid recovery section of the cleaning jig to coincide with the vicinity of the boundary between the substrate to be processed or dummy substrate and the immersion supporting plate and cleaning the immersion supporting plate.

According to a further aspect of the invention, there is provided a pattern forming method comprising: forming on a substrate to be processed a resist film or a resist layer composed of a resist film and an immersion protective film on the resist film; placing a substrate to be processed in which the resist layer has been formed on a stage of an immersion exposure apparatus and arranging an immersion supporting plate around the substrate to be processed; determining an immersion boundary between an immersion area contact part and an immersion area noncontact part on the immersion supporting plate formed when an immersion area is moved according to a predetermined exposure area and an exposure map; cleaning at least a part of the immersion boundary on the immersion supporting plate while moving a cleaning jig along the determined immersion boundary; after the immersion supporting plate has been cleaned, not only forming an immersion area on the resist layer but also moving the immersion area according to a predetermined exposure area and an exposure map, thereby making immersion exposure of the substrate to be processed placed on the stage via the immersion area; and forming a resist pattern by developing the exposed resist layer.

BRIEF DESCRIPTION OF THE SEVERAL VIEWS OF THE DRAWING

FIG. 1 is a plan view showing the relationship between a substrate to be processed, an immersion supporting plate, an exposure area, and an immersion area in making exposure by an immersion exposure method;

FIG. 2 is a plan view showing an immersion boundary expected when exposure is made according to an exposure area and an exposure map;

FIG. 4 is a plan view schematically showing the configuration of an immersion exposure apparatus (cleaning apparatus) used in a first embodiment of the invention;

FIG. 5 is a sectional view schematically showing the configuration of the immersion exposure apparatus (cleaning apparatus) used in the first embodiment;

FIG. 6 is a plan view showing a cleaning path and an immersion boundary to help explain the first embodiment;

FIG. 7 is a plan view showing the way an immersion area (cleaning jig) is provided on a cleaning substrate and the edge parts that fronts the edge of the substrate, of an immersion supporting plate are cleaned to help explain a second embodiment of the invention; and FIGS. 8A and 8B are sectional views showing a cleaning liquid ejection mechanism to help explain the second embodiment.

DETAILED DESCRIPTION OF THE INVENTION

Figure 3:
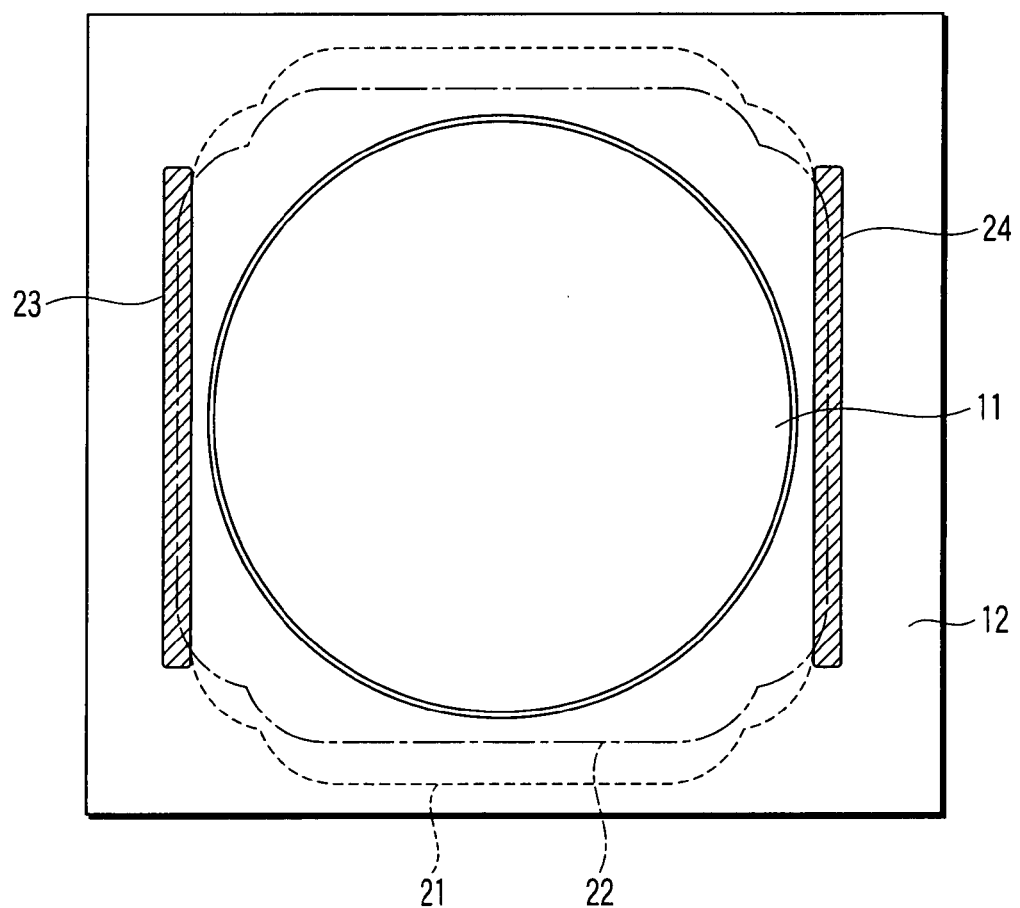
FIG. 3 is a plan view showing the individual immersion boundaries and parts which require cleaning in the immersion exposure of different patters.

Hereinafter, referring to the accompanying drawings, embodiments of the invention will be explained in detail.

First Embodiment

FIG. 1 is a plan view showing the relationship between a substrate to be processed, an immersion supporting plate, an exposure area, and an immersion area in making exposure by an immersion exposure method.

A substrate to be processed 11, as a substrate to be exposed, is held on an exposure stage (not shown). When the peripheral parts of the substrate to be processed 11 are exposed, since an immersion area sticks out from the substrate, the immersion area is disturbed outside the substrate. To prevent this, an immersion supporting plate 12 is provided around the substrate to be processed 11.

If the diameter of the exposure stage is larger than that of the substrate to be processed 11, the immersion supporting plate 12 is placed on the exposure stage. If the diameter of the exposure stage is same or smaller than that of the substrate to be processed 11, the immersion supporting plate 12 is placed as an immersion supporting stage around the substrate to be processed 11 and exposure stage, not on the exposure stage.

FIG. 1 schematically shows a case where the peripheral exposure area of the substrate to be processed 11 is being exposed. In FIG. 1, a hatching area enclosed by a circle 13 is an immersion area. In the immersion area, a square area 14 enclosed by a dot-dash line is an exposure area. When the exposure area 14 is exposed, the immersion area 13 sticks out from the substrate to be processed 11. However, since the immersion supporting plate 12 exists in the area outside the substrate to be processed 11 into which the immersion area 13 has stuck out, an immersion liquid cannot flow from the immersion area 13 to the outside.

FIG. 2 shows a portion with which the immersion area 13 makes contact at least once when exposure is made via the circular immersion area 13 on the basis of an exposure map (dot-dash line) where the square exposure area 14 is provided on a single substrate to be processed 11. A dotted line part 15 on the immersion supporting plate 12 is an immersion boundary between an immersion area contact part 16 and an immersion area noncontact part 17. In the area of the immersion boundary 15, traces of ions, molecular or particles included in the immersion liquid precipitate, resulting in a dust source. The region to be cleaned in the embodiment is the area of the immersion boundary 15.

FIG. 3 shows an immersion boundary and a part which requires cleaning when each of different patterns is subjected to immersion exposure.

In FIG. 3, the immersion boundary 21 shown by a dotted line is for the preceding exposure (first exposure) of the substrate to be processed. Since the exposure map and/or the exposure area have been changed in the next exposure (second exposure) of the substrate to be processed, it is assumed that the immersion boundary 22 shown by a dot-dash line is obtained. When the two boundaries 21, 22 are compared with each other, the immersion boundary 22 in the second exposure has parts located outside the immersion boundary 21 in the first exposure with respect to the substrate to be processed 11. Accordingly, when the second exposure is made without modification, the immersion area 13 involves the particles or precipitates formed at the boundary 21 in the first exposure in the parts, causing the problem of deteriorating the image quality at the time of exposure.

In the embodiment, to overcome this problem, the parts where the immersion boundary 22 in the second exposure are outside the immersion boundary 21 in the first exposure with respect to the substrate to be processed 11 are extracted after the completion of the first exposure and before the second exposure. Then, the parts are set as cleaning areas 23, 24. The path through which the cleaning area 23 moves to the cleaning area 24 and the path through which the cleaning area 24 moves to the cleaning area 23 are determined as shown in FIG. 6 explained later. That is, as the path for cleaning the immersion boundary 22 in the second exposure, the path is so determined that the cleaning jig is moved around counterclockwise several times (two-dot chain line). The path is optimized in such a manner that the edge parts that front the edge of the substrate, of the immersion supporting plate 12 facing the substrate to be processed 11 can be cleaned by moving the cleaning jig along the path.

FIGS. 4 and 5 are diagrams to help explain the immersion exposure apparatus of the first embodiment in detail. FIG. 4 is a plan view of the immersion exposure apparatus. FIG. 5 is a sectional view of the immersion exposure apparatus taken along line I-I of FIG. 4. The immersion area is formed by holding the immersion liquid 43 with an immersion area forming jig 42 provided so as to surround an exposure lens 41. The immersion liquid 43 is supplied from an immersion liquid supply section (not shown) of the immersion area forming jig 42 and is drained away from an immersion suction drainage section 44 provided in the lower part of the immersion area forming jig 42. The immersion liquid at the surface of the substrate in the immersion area used in this case is adjusted so as to flow from almost the center of the immersion area toward the outer edge.

FIG. 6 shows a method of cleaning the immersion boundary using the immersion exposure apparatus. The immersion area is formed using the immersion area forming jig 42 shown in FIGS. 4 and 5.

Control is so performed that the center of the immersion area 51 for cleaning moves counterclockwise along a two-dot chain line in the direction shown by the arrow in FIG. 6. This makes it possible not only to discard the particles or precipitates remaining in the immersion boundary 21 in the first exposure from the drain outlet of the immersion area 51 but also to transport the particles or precipitates still remaining outside, beyond the immersion boundary 22 in the second exposure. Taking the flow of the liquid in the immersion area into account, a movement is made between the two areas in such a manner that the particles or precipitates in the immersion area 21 in the first exposure are prevented from entering the immersion area 22 in the second exposure.

While in the first embodiment the immersion exposure apparatus has been used as a cleaning jig, the invention is not limited to this. For instance, even when the same process was carried out using a special cleaning jig, equivalent effects as described below were obtained. Moreover, the transfer path is not limited to the aforementioned one and may be changed suitably without departing from the spirit of the invention.

When an immersion supporting plate 12 not carrying out those processes was used, the number of particles on the substrate to be processed 11 was 120 to 250 count/waf and many of the particles were large in size, particularly found in the peripheral part. In the embodiment, however, the number of particles was reduced to 20 count/waf or less and the particles were suppressed to those of smaller sizes, eliminating an unusual distribution. Even in the evaluation of defects in the resist pattern produced by immersion exposure using the immersion supporting plate 12 cleaned by the method of the first embodiment, the number of defects caused by particles, such as pattern fluctuations or pattern deformation, decreased remarkably to about $1/10$ to $1/50$ of the number of defects when the processes were not carried out.

While in the embodiment, the immersion area has been described as circular, it may take another form, such as a rectangle or an oval figure. While the liquid has been described as flowed from the center of the immersion area toward the outer edge, the liquid may flow in one direction. The flow may be changed suitably according to the direction in which particles are discharged. The size of the immersion area is not limited to that in the embodiment.

It is desirable that the immersion liquid used in cleaning the immersion supporting plate 12 should be purified water when contaminated objects are water-soluble, an acid solution when contaminated objects are soluble in acid, an alkali solution when contaminated objects are soluble in alkali, ozone water when contaminated objects are organic matter, and carbonated water or hydrogen water when contaminated objects are charged particles. A mixture of these may be used. For instance, when there are substances soluble in acid and charged particles, an acid solution and hydrogen water may be mixed. Moreover, for instance, when substances soluble in alkali and organic matter are mingled, an alkali solution and ozone water may be mixed. When chemicals react with one another, they may be supplied in sequence. For instance, when charged particles and organic matter are mingled, the immersion supporting plate is cleaned with ozone water and then cleaned with hydrogen water. Alternatively, the immersion supporting plate is cleaned with hydrogen water and then cleaned with ozone water. It has been verified that either method has the effect of decreasing particles and foreign substances.

As described above, with the first embodiment, cleaning the part of the immersion boundary 21 in the first exposure located inward of the immersion boundary 22 in the second exposure with respect to the substrate to be processed 11 enables particles or precipitates developed at the immersion supporting plate 12 in the first exposure to be prevented from having an adverse effect on the second exposure. Furthermore, since the cleaning liquid is caused to move outward to the immersion boundary 21 in the first exposure with respect to the substrate to be processed 11, particles or precipitates at the immersion boundary 21 in the first exposure can be reliably prevented from entering the immersion area 22 in the second exposure. Moreover, with the first embodiment, since the areas where particles or precipitates can be involved in the second exposure are extracted and cleaned, the immersion supporting plate 12 can be cleaned in a shorter period of time with higher accuracy than when the entire surface of the supporting plate 12 is cleaned.

Accordingly, with the first embodiment, it is possible to prevent the increase of particles at the exposure area with the immersion boundary of the immersion supporting plate provided around the substrate to be processed in the immersion exposure apparatus and therefore decrease exposure defects and improve the exposure accuracy.

Second Embodiment

A second embodiment of the invention relates to a method of cleaning dirt from the edge part that fronts the edge of the substrate, of an immersion supporting plate. As shown in FIG. 7, a cleaning substrate (or dummy substrate) 61 is provided on an exposure stage (not shown) in place of a substrate to be processed 11 and an immersion supporting plate 12 is provided around the cleaning substrate 61. Then, a cleaning jig is so set that the drain section of the cleaning jig forming an immersion area 51 roughly coincides with the boundary between the cleaning substrate 61 and the immersion supporting plate 12. The cleaning jig may be the immersion exposure apparatus itself or a special jig.

The cleaning jig is moved counterclockwise continuously in this order: position A→position B→position C→position D. The cleaning liquid is caused to flow from the center of the immersion area 51 toward the outer edge. Then, the cleaning liquid is caused to pass through the boundary between the cleaning substrate 61 and the immersion supporting plate 12, thereby cleaning the brim of and the vicinity of the brim of the immersion supporting plate 12.

The cleaning liquid passed through the boundary is drained from a drainage trench 62 provided under the boundary as shown in the sectional view of FIG. 8A. Moreover, as shown in FIG. 8B, the cleaning liquid may be drained from an immersion liquid suction drainage section 44 provided at the undersurface of the immersion area forming jig 42 at the boundary. This makes it possible to clean the edge part that front the edge of the substrate, of the immersion supporting plate 12. In particular, dirt (such as particles or precipitates) 18 at the edge part that front the edge of the substrate, of the immersion supporting plate 12 can be removed efficiently. Then, causing the immersion area 51 to move around at least once along the boundary enables all of the edge part that front the edge of the substrate, of the immersion supporting plate 12 to be cleaned.

Here, the drainage section 44 of the cleaning jig is provided so as to roughly coincide with the boundary between the cleaning substrate 61 and the immersion supporting plate 12, which enables the contaminant at the edge part to be disposed of efficiently without contaminating any jig constituting the edge peripheral part of the immersion supporting plate 12 and immersion area 51.

While in the second embodiment the immersion area 51 has been set on the cleaning substrate 61 and then cleaning has been done, the invention is not limited to this. For instance, the immersion area 51 may be set on the immersion supporting plate 12 and the drainage section of the immersion area 51 may be caused to roughly coincide with the boundary between the cleaning substrate 61 and the immersion supporting plate 12, thereby doing similar cleaning.

When an immersion supporting plate 12 not carrying the aforementioned processes was used, many particles were found in the peripheral part of the immersion supporting plate 12. In the second embodiment, however, an unusual distribution has not developed. Even in the evaluation of defects in the resist pattern produced by immersion exposure using the immersion supporting plate 12 cleaned in the second embodiment, the number of defects caused by particles, such as pattern fluctuations or pattern deformations, decreased remarkably as compared with a case where the processes were not carried out.

While in the second embodiment the immersion area has been circular, it may take another form, such as a rectangle or an oval figure. While the liquid has flowed from the center of the immersion area toward the outer edge, the liquid may flow in one direction. The point is that the cleaning liquid in the immersion area has to flow toward the boundary between the cleaning substrate and the immersion supporting plate 12. Moreover, the cleaning liquid may be modified as explained in the first embodiment.

As described above, with the second embodiment, since the cleaning jig is set in such a manner that the drainage section of the immersion area 51 for cleaning roughly coincides with the boundary between the cleaning substrate 61 and the immersion supporting plate 12 and the cleaning liquid flows toward the boundary and is drained from the boundary part, dirt at the edge part that fronts the edge of the substrate, of the immersion supporting plate 12 can be cleaned effectively. Therefore, it is possible to prevent the increase of particles at the immersion supporting plate provided around the substrate to be processed in the immersion exposure apparatus, and therefore decrease exposure defects and improve the exposure accuracy.

(Modification)

The invention is not limited to the above-described embodiments. The structure of the cleaning jig is not restricted to that shown in FIG. 5 and may be modified suitably according to the specification. Moreover, cleaning has to be performed after the first exposure of a plurality of substrates to be processed has been completed and before the second exposure of the plurality of substrates to be processed is started. The invention is not limited to this. Cleaning may be done suitably when it is conceivable that particles or precipitates on the immersion supporting plate have an effect on exposure. Moreover, the conditions, including the type of the cleaning liquid and the quantity of flow, may be changed according to the specification.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of cleaning an immersion supporting plate provided around a substrate to be processed in immersion exposure, the method comprising:
    determining a first immersion boundary between an immersion area contact part and an immersion area noncontact part on the immersion supporting plate formed when an immersion area of an immersion liquid is moved according to a predetermined exposure area and a first exposure map; and
    after a first exposure is performed according to the first exposure map, cleaning at least a part of the first immersion boundary on the immersion supporting plate, while moving a cleaning jig along the first immersion boundary,
    wherein the at least a part of the first immersion boundary to be cleaned is located inward of a second immersion boundary determined by an exposure area to be exposed at a second exposure which is next to the first exposure and by a second exposure map.

2. The method according to claim 1, wherein the immersion area contact part is an area with which the immersion liquid makes contact at least once in exposing a single substrate to be processed.

3. The method according to claim 1, wherein the immersion area contact part is an area with which the immersion liquid makes contact at least once in exposing a plurality of substrates to be processed.

4. The method according to claim 1, wherein an edge of the immersion supporting plate facing an edge of the substrate is cleaned at the same time that the at least a part of the first immersion boundary is cleaned.

5. The method according to claim 4, wherein an edge that fronts an edge of the substrate, of the immersion supporting plate is cleaned by providing an immersion jig so as to lie between the at least a part of the first immersion boundary and the edge that fronts the edge of the substrate, of the immersion supporting plate.

6. The method according to claim 4, wherein the edge that fronts the edge of the substrate, of the immersion supporting plate is cleaned by causing a cleaning liquid to flow from the immersion area contact part toward the edge of the immersion supporting plate.

7. The method according to claim 1, wherein the cleaning is done by causing a cleaning liquid to flow from the immersion area contact part toward the immersion area noncontact area.

8. The method according to claim 1, wherein the cleaning jig is the same as an immersion jig used to form the immersion area.

9. A method of an immersion exposure, providing an immersion supporting plate around a substrate to be processed placed on a stage and exposing the substrate to be processed by moving an immersion area according to a predetermined exposure area and an exposure map, the method comprising:
    extracting an immersion boundary between an immersion area contact part and an immersion area noncontact part on the immersion supporting plate formed in moving the immersion area for the exposure to clean the immersion supporting plate regularly;
    determining a transfer path of a cleaning jig on the basis of the extracted immersion boundary; and placing the substrate to be processed or a dummy substrate on the stage and cleaning at least a part of the immersion boundary on the immersion supporting plate by moving a cleaning jig on the basis of the transfer path, with the immersion supporting plate arranged around the substrate, and causing a cleaning liquid to flow from the immersion area contact part toward the immersion area noncontact part and toward an edge of the immersion supporting plate near the edge thereof, wherein the immersion boundary to be cleaned is a part which belongs to a first immersion boundary formed by a previous exposure and which is located inward of a second immersion boundary determined by an exposure area to be exposed next and the exposure map.

10. The method according to claim 9, wherein the immersion area contact part is an area with which an immersion liquid makes contact at least once in exposing a single substrate to be processed.

11. The method according to claim 9, wherein the immersion area contact part is an area with which an immersion liquid makes contact at least once in exposing a plurality of substrates to be processed.

12. The method according to claim 9, wherein the cleaning is done by causing a cleaning liquid to flow from the immersion area contact part toward the immersion area noncontact part.

13. The method according to claim 9, wherein the cleaning jig is the same as an immersion jig used to form the immersion area.

14. A method of cleaning an immersion supporting plate provided around a substrate to be processed, placed on a stage and subjected to immersion exposure, the method comprising:

placing the substrate to be processed or a dummy substrate on the stage;

arranging the immersion supporting plate around the substrate to be processed or the dummy substrate; and moving a cleaning jig having a cleaning liquid recovery section on a bottom thereof along a boundary between the substrate to be processed or the dummy substrate and the immersion supporting plate; and causing a cleaning liquid to flow into an area including the boundary while causing the cleaning liquid recovery section of the cleaning jig to coincide with the vicinity of the boundary, thereby cleaning an edge of the immersion supporting plate and sucking the cleaning liquid to the cleaning liquid recovery section.

* * * * *